TUNING INDICATOR FOR FREQUENCY MODULATION RECEIVERS

Filed Sept. 30, 1947

INVENTOR.
John P. Grant

BY T. L. Bowes

Attorney

Patented July 4, 1950 2,514,327

UNITED STATES PATENT OFFICE 2,514,327

TUNING INDICATOR FOR FREQUENCY MODULATION RECEIVERS

John P. Grant, Rochester, N. Y., assignor to Stromberg-Carlson Company, a corporation of New York Application September 30, 1947, Serial No. 776,994

9 Claims. (Cl. 250—40)

Figures 1, 2:
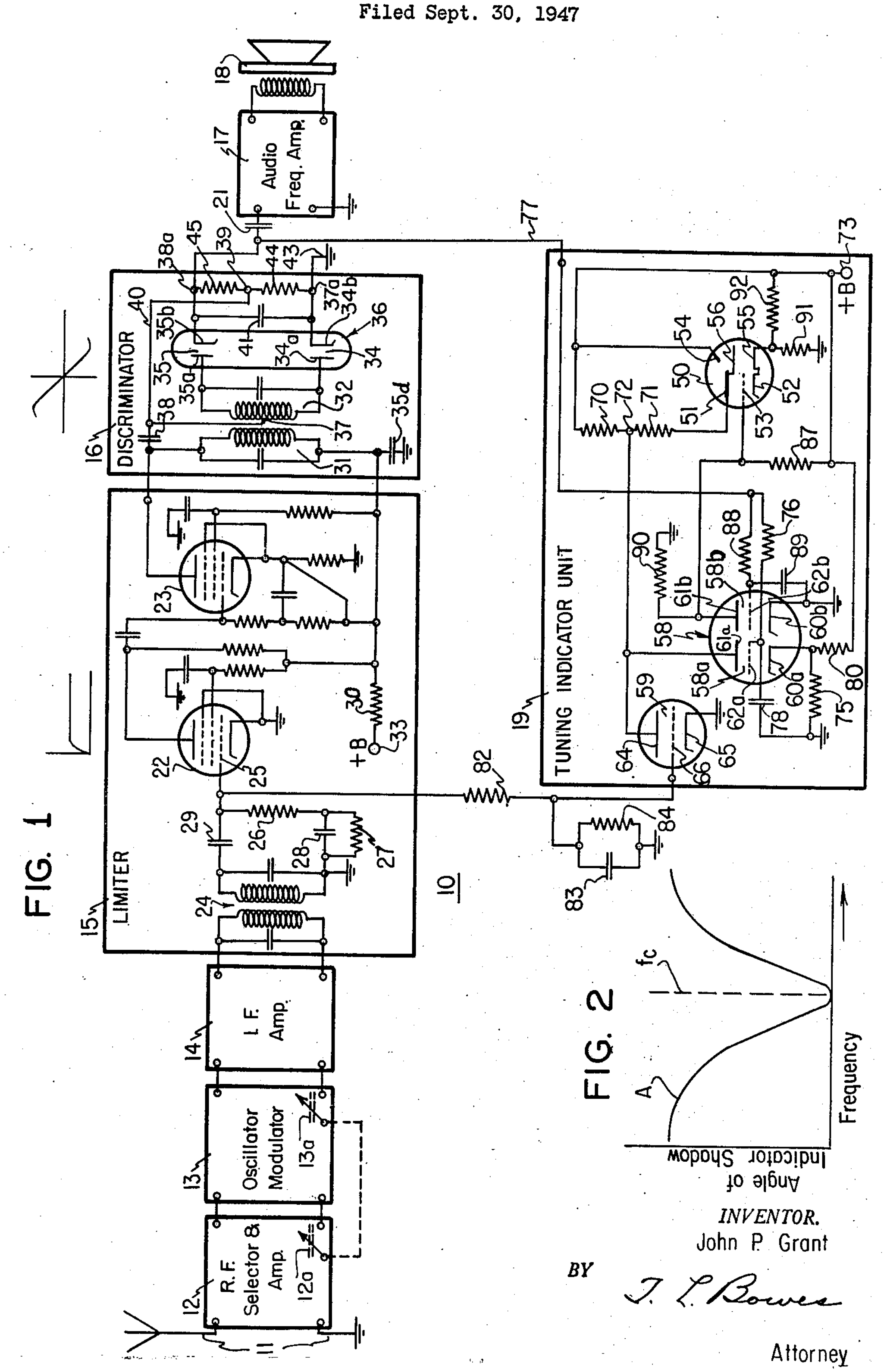

The present invention relates to tuning indicator circuits for wave signal receiver systems and, more particularly, to means for accurately indicating the tuning condition of receivers for angular velocity-modulated carrier waves such as frequency modulation receivers, thereby insuring accurate tuning to substantially the exact center frequency of a desired frequency modulated carrier signal in a receiver designed for such reception.

It is a well-known fact that proper tuning of a frequency modulation wave signal receiver comprises tuning to the exact center frequency of frequency modulated waves if the most satisfactory signal to noise ratio is to be obtained, and if distortion is to be reduced to a minimum. In conventional frequency modulation receivers, the frequency modulated signal is converted to an intermediate frequency signal which is passed through a limiter to remove amplitude modulations. To detect the modulating component in frequency modulation receivers a so-called "discriminator network" is employed which may comprise a pair of coupled tuned circuits, each tuned to the center frequency of the applied frequency modulation signal.

In one type of discriminator the high potential side of the first tuned circuit is capacitively coupled to the mid-point of the second tuned circuit. The output of the second tuned circuit is furthermore supplied to opposed rectifiers so that when a frequency modulated signal is applied to the discriminator having a center frequency equal to the frequency to which the aforesaid tuned circuits are tuned, then the output voltage is zero. When the center frequency of the applied frequency modulation wave departs from the center frequency of the discriminator circuits, then a direct current voltage is produced of a polarity and magnitude depending upon the direction and extent of the frequency deviation of the center frequency of the discriminator circuit. It will be understood that the audio modulation components appearing at the output of the discriminator are supplied to suitable audio circuits in a conventional manner through a suitable capacitive coupling or the like. It has been customary to utilize a visual tuning indicator for enabling the user of the wave signal receiver of the frequency modulation type to tune the set so that the center frequency of the frequency modulated signal is effectively equal to the center frequency of the tuned circuits of the discriminator network.

Conventional discriminator circuits have a characteristic of generally S-shaped configuration with a substantial portion thereof providing a linear relationship. The point of accurate tuning occurs at the center of this S-shaped discriminator characteristic and for best operation the mean carrier freqency of the applied signal must be held at this point. Various tuning indicating devices which have been employed heretofore have required the discriminator load to be raised above ground as for example by grounding through a suitable capacitor or the like. It will be understood that such a capacitor adds to the cost of the receiver since it must be capable of providing a path to ground at audio frequencies. Also by maintaining the cathodes above ground the hum problem due to leakage between the cathode and the filaments or heaters is more severe. Furthermore when the discriminator load is maintained at ground potential it provides a very satisfactory point for obtaining an AVC voltage and does not require a separate diode for this purpose. It would be desirable to provide an arrangement in which it is not required that the discriminator load be raised off ground. Although tuning indicator circuits used heretofore have provided sensitive arrangements for the no signal indicating condition they have not provided very sensitive arrangements for indicating the condition of substantially zero direct current voltage across the discriminator load. It would also be desirable to provide a more sensitive indication of the zero voltage condition across the discriminator load than has heretofore been possible by arrangements which have been employed.

Accordingly, it is an object of the present invention to provide a new and improved tuning indicator circuit particularly adaptable for use with a frequency or phase modulation receiver.

It is another object of the present invention to provide a frequency or phase modulation receiver tuning indicator which does not require the discriminator load to be raised off ground.

Still another object of the present invention is to provide a tuning indicator particularly adaptable for frequency modulation wave signal receivers in which more sensitive indications are provided, not only with reference to a "no signal" condition but also with reference to conditions when the voltage across the discriminator load is zero.

Further objects and advantages of the present invention will become apparent as the following description proceeds and the features of novelty which characterize the invention will be pointed out with particularity in the claims annexed to and forming a part of this specification.

For a better understanding of the present invention, reference may be had to the accompanying drawing in which Fig. 1 is a diagrammatic representation of a wave signal receiver embodying the tuning indicator circuit of the present invention, the major portion of the wave signal receiver being set forth in block diagram; and Fig. 2 is a curve diagram to aid in understanding the operation of the tuning indicator circuit of the present invention.

Referring now to Fig. 1 of the drawing, there is illustrated a wave signal receiver generally designated at 10 which is illustrated as a conventional frequency modulation receiver, with which is associated the tuning indicator circuit of the present invention. As illustrated, the wave signal receiver 10 comprises an antenna-ground circuit 11 for receiving frequency modulated carrier waves. It will be understood that the antenna-ground circuit 11 preferably comprises a type of signal collector satisfactory for receiving frequency modulated waves such, for example, as a dipole or the like. The wave signal receiver 10 further includes a radio frequency selector and amplifier 12, an oscillator modulator unit 13, an intermediate frequency amplifier 14, a limiter 15, a discriminator 16, an audio frequency amplifier 17, and a signal reproducer or loud speaker 18 connected in cascade in the order named. In addition, the wave signal receiver 10 includes the tuning indicator circuit generally designated as 19, with which the present invention is particularly concerned and which is described in greater detail hereinafter.

The operation of a wave signal receiver of the frequency modulation type such as 10 will be well understood by those skilled in the art. Briefly, however, the frequency modulated carrier is intercepted by the antenna-ground circuit 11 and supplied to the radio frequency selector and amplifier unit 12 where this carrier signal is selected and amplified. For the purpose of making such a selection, suitable resonant frequency varying means, schematically indicated as a variable condenser 12*a*, is illustrated. Such tuning means are furthermore illustrated as being arranged for gang operation with additional tuning means such as the variable condenser 13*a* associated with the oscillator modulator unit 13. The amplified and selected radio frequency signals from the unit 12 are supplied to the oscillator modulator unit 13, which may comprise the well-known pentagrid converter for converting the radio frequency signal to an intermediate frequency signal. It should be understood, however, that the oscillator modulator unit 13 may comprise two separate stages, (1) an oscillator stage for producing oscillations which are combined with the radio frequency signals and (2) a modulator stage to produce a beat frequency which is generally referred to as the intermediate frequency. This intermediate frequency may comprise various values and by way of example it is assumed that the center frequency designated as $f_c$ for the intermediate frequency signal is 10.7 megacycles which will serve for both the 42 to 50 megacycle band as well as the 88 to 108 megacycle band. The output of the intermediate frequency amplifier unit 14 is supplied to a limiter which may have one or more stages, the purpose of which is to eliminate completely any amplitude modulations which may be present whereby full realization of the noise-reducing benefits of a frequency modulation system is possible.

The limiter unit 15 has the well-known limiter characteristics indicated directly above the unit in Fig. 1 of the drawing. The limiter acts in the manner of a saturated amplifier and chops off the peaks of the intermediate frequency signal so as to prevent any amplitude variation produced in the modulated carrier signal by noise impulses, fading, and the like from reaching the discriminator network 16 which is essentially the second detector stage in a frequency modulation receiver. The discriminator characteristic is indicated above the discriminator unit 16 in Fig. 1 of the drawing. The output of the discriminator which effectively detects the modulating component of the radio frequency signal is supplied through a coupling capacitor 21 to an audio frequency amplifier unit 17, the output of which is supplied to the signal reproducer or loud speaker 18 in a conventional manner.

Although the limiter 15 and the discriminator 16 are of generally conventional construction they have been illustrated in detail in the drawing for the purpose of better understanding the tuning indicator unit of the present invention. Also since the input to the tuning indicator unit 19 is partially supplied from the limiter 15 as well as from the discriminator 16 a brief description of both the limiter 15 and the discriminator 16 is deemed desirable.

Although the limiter 15 might comprise a single tube it has been specifically illustrated as a cascade limiter comprising a first limiter tube 22 and a second limiter tube 23. The output of the intermediate frequency amplifier unit 14 is supplied through a suitable intermediate frequency coupling transformer generally designated at 24 to the control electrode 25 of the first limiter tube 22. As was mentioned above this limiter tube 22 is of the plate saturation type where low plate and screen voltages are used to limit the plate current flow at high signal amplitudes. In order to provide a self bias, series resistors 26 and 27 are connected across the grid to cathode circuit of the tube 22. A suitable capacitor 28 is connected across the resistor 27 and a blocking capacitor 29 prevents rectified current due to grid rectification in the tube 22 from flowing through the secondary winding of the intermediate frequency coupling transformer 24. With this arrangement it will be apparent that the higher the amplitude of the signal applied to the limiter 15 the greater will be the negative bias applied to the grid 25 by the self biasing circuit described. By employing two limiter tubes such as 22 and 23 it is possible to get an optimum limiter characteristic which provides effective operation on impulse noise while still providing satisfactory operation for a wide range of input signal strengths. Since the details of the limiter 15 other than those described are unimportant as far as the present invention is concerned, no further discussion thereof is included since the operation thereof will be obvious to those skilled in the art.

It should be understood that the particular discriminator unit 16 illustrated in Fig. 1 of the drawing is by way of example only and any other suitable discriminator circuit such for example as the well-known discriminator employing three tuned circuits might equally well be employed. As illustrated the discriminator 16 comprises the widely used so called "series" or center tuned discriminator circuit comprising two tuned circuits 31 and 32, both tuned exactly to the center frequency $f_c$ of the intermediate frequency signal. The primary tuned circuit 31 is connected in the plate circuit of the second limiter tube 23 and supplied from a suitable source of +B potential designated at 33 through a voltage dropping resistor 30. The secondary tuned circuit 32 has the inductance thereof coupled to the inductance of the primary tuned circuit 31 in a conventional manner. A suitable radio frequency by-pass condenser 35d is provided to by-pass to ground any radio frequencies and prevent them from affecting the source 33 of +B potential. The inductance of the tuned circuit 32 is center tapped as indicated at 37 and the center tap is connected to the tuned circuit 31 through a suitable coupling capacitor 38. The terminals of the secondary tuned circuit 32 are connected to the anodes 34a and 35a respectively of the diodes or rectifiers 34 and 35 illustrated as being disposed in a single envelope of a twin diode 36. The cathodes 34b and 35b of the diodes 34 and 35 are connected to the end terminals 37a and 38a respectively of a pair of identical resistors 44 and 45 connected in series and having a common terminal 39. The common terminal 39 of the resistors 44 and 45 whose end terminals 37a and 38a are connected to the cathodes of the diodes 34 and 35 respectively is connected by a suitable connector 40 with the center tap 37 of the inductance of the tuned circuit 32. A suitable intermediate frequency by-pass condenser 41 is connected across the end terminals of the series resistors 44 and 45 or in other words across the cathodes 34b and 35b of the diodes 34 and 35. In accordance with the present invention the end terminal of the resistor 44 connected to the cathode 34b is connected directly to ground as indicated at 43 whereby the discriminator load circuit is maintained at ground potential.

It will be understood that the voltage applied to the rectifiers or diodes 34 and 35 consists of two components, the component induced in the secondary tuned circuit 32 by the inductive coupling with the primary tuned circuit 31, and the component fed to the center tap 37 of the secondary tuned network 32 through the capacitor 38. The phase relationship between these two components is such that at resonance the rectified load currents flowing in the resistors 44 and 45 are equal in amplitude but flow in opposite directions so that the net voltage across the terminals 37a and 38a is zero. When the carrier frequency deviates from resonance or in other words from the center frequency $f_c$ which is the fequency of the tuned circuits 31 and 32 the induced secondary current in the tuned circuit 32 either lags or leads depending upon whether the deviation is to the high frequency side or to the low frequency side and this phase shift causes the induced current to combine with the current fed through the capacitor 38 in such a way that one diode such as 34 or 35 gets more voltage than the other when the frequency is below resonance while the other diode gets the larger voltage when the frequency is higher than resonance. The voltage occurring across the terminals 37a and 38a is the difference between the two diode voltages. Thus a characteristic like that illustrated above the discriminator unit 16 appearing in Fig. 1 of the drawing results and the straight line portion of this characteristic is the useful detector characteristic. The discriminator circuit is usually designed so that the peaks of the characteristic shown above the unit 16 in Fig. 1 of the drawing fall just outside the limits of the pass band of the intermediate frequency amplifier 14.

Since the voltage appearing at the terminal 38a is directly indicative of the frequency deviation with reference to the center frequency $f_c$ it is also representative of the modulating signal originally applied to the carrier wave by frequency modulating the same. Consequently this audio frequency output appearing at the terminal 38a of the discriminator unit 16 is supplied through the coupling capacitor 21 to the audio frequency amplifier 17 and to the signal reproducer 18.

From the foregoing description it will be understood that mistuning of the wave signal receiver 10 is indicated by the appearance of a direct current voltage across the terminals 37a and 38a, the magnitude of this voltage being directly representative of the amount of mistuning and the polarity being representative of the direction of mistuning. If the wave signal receiver 10 is tuned to the center frequency $f_c$ of the discriminator network 16 no direct current voltage would appear across the terminals 37a and 38a. On the other hand if the wave signal receiver 10 is mistuned so that the center frequency of the received carrier when converted to an intermediate frequency is either above or below the center frequency $f_c$ then direct current voltage appears across the terminals 37a and 38a. The capacitor 21 to some extent prevents this direct current voltage from affecting the audio circuits of the receiver 10 comprising the units 17 and 18. However such mistuning causes distortion and generally undesirable reception.

For the purpose of giving an indication of the tuning condition of the wave signal receiver 10 it is customary to employ an electron-ray tube generally designated at 50 which may comprise any of the well-known types of indicating tubes, such as designated by the nomenclature 6U5/6G5 or 6AB5/6N5 for example. It will be understood that such electron-ray tubes essentially comprise two main parts (1) a triode which operates as a direct current amplifier and illustrated as comprising the anode 51, the cathode 52 and the control electrode 53 and (2) an electron-ray indicator which comprises a target 54 which is provided with a fluorescent coating so as to glow when struck by electrons from the cathode 55 which is connected to the cathode 52. A ray control electrode 56 is mounted between the cathode 55 and the target 54. When the potential of this electrode 56 is less positive than the potential of the target 54 electrons flowing to the target are repelled by the electrostatic field of the electrode 56 and do not reach that portion of the target behind the electrode 56. Because the target 54 does not glow where it is shielded from the electrons, the control electrode 56 effectively casts a shadow on the glowing target 54. The extent of this shadow various from a fairly wide angle of approximately 100° of the target when the control electrode is much more negative than the target to zero degrees of angle when the control electrode 56 is at approximately the same potential as the target 54. As normally employed accurate tuning is indicated by substantially zero shadow angle and the magnitude of mistuning is indicated by the width of the shadow angle. It will be understood by those skilled in the art that in this type of indicating tube the target is usually shaped as the frustrum of a cone disposed in the bulb portion of the tube. The target is visible by looking directly into the bulb end of the tube so as to observe the shadow or non-glowing portion of the fluorescent frustro-conical target.

In accordance with the present invention such an electron-ray tube 50 is employed in the tuning indicator unit 19. To provide more sensitive operation and to obtain the desirable characteristics enumerated above the tuning indicator unit 19 further includes a plurality of electron discharge valves designated respectively as 58*a*, 58*b* and 59. As illustrated the electron discharge valves 58*a* and 58*b* are in the form of a twin triode designated by the reference numeral 58 having individual cathodes 60*a* and 60*b* respectively as well as anodes 61*a* and 61*b* and control electrodes 62*a* and 62*b* respectively. It will be understood that electron discharge valves 58*a* and 58*b* might comprise two independent envelopes. The electron discharge valve 59 on the other hand is illustrated as a single triode comprising the anode 64, the cathode 65 and the control electrode 66. The electron discharge valves 58*a*, 58*b* and 59 might be generally designated as frequency modulation tuning indicator amplifiers. Preferably however the electron discharge valve 58*a* is designated as the discriminator zero output voltage control tube while the electron discharge valve 58*b* is designated as the grid potential control tube for the electron-ray tube 50. In addition the electron discharge valve 59 may be designated as the zero input signal control tube.

For the purpose of operating the electron-ray tube or indicator tube 50, the target 54 thereof is connected to one end of a suitable resistor 70. The plate 51 of the triode section of the electron ray-tube and consequently also the ray control electrode 56 are connected to one end of a resistor 71. The other terminals of the resistors 70 and 71 are connected to a common terminal 72 so that effectively the resistors 70 and 71 are connected in series between the target 54 and the ray control electrode 56. As was mentioned above to operate the target 54 at a positive voltage it is connected directly to a source 73 of +B potential. As long as no current flows through one or both of the resistors 70 and 71 the ray control electrode 56 is at the same potential as the target 54 so that the electrostatic field produced by the ray control electrode 56 does not repel electrons flowing from the cathode 55 to the target 54. Consequently the condition of minimum shadow angle exists. If on the other hand a current flows through the resistor 70 for example the potential of the ray control electrode 56 is less positive than that of the target 54 so that the electrostatic field produced repels electrons tending to flow from the cathode 55 to the target 54, then a variable portion of the frustro-conical target 54 is caused to glow, the variable portion depending upon the magnitude of the current flow through the resistor 70.

It will be understood by those skilled in the art that when the direct current potential at the terminal 38*a* of the discriminator 16 is zero the center signal frequency $f_c$ corresponds to the resonant frequency of the discriminator. Under these conditions it is desirable to have a minimum shadow angle indicated by the electron ray tube 50. To this end the anode 61*a* of the electron discharge valve 58*a* is connected to the terminal 72 and the cathode 60*a* of electron discharge valve 58*a* is connected to ground through a suitable resistor 75. The control electrode 62*a* of electron discharge valve 58*a* on the other hand is connected through a suitable current limiting resistor 76 and a conductor 77 to the terminal 38*a* of the discriminator 16. The control electrode 62*a* is furthermore by-passed to ground for audio frequencies by means of a capacitor 78. In accordance with the present invention the electron discharge valve 58*a* is operated so as to be effectively biased to cut off when no signal is applied to the control electrode 62*a*. This is accomplished as illustrated by applying a positive potential from the +B source 73 to the cathode 60*a* of the electron discharge valve 58*a* through a voltage dropping resistor 80. With this arrangement it will be apparent that whenever the output voltage of the discriminator 16 at the terminal 38*a* is equal to zero then electron discharge valve 58*a* passes no plate current and as a result no current flows through resistor 70, and as far as electron discharge valve 58*a* is concerned the electron-ray tube 50 operates with a minimum shadow angle indicating proper tuning of the wave signal receiver 10.

It will be understood that if the direct current output voltage of the discriminator 16 is zero due to the fact that no signal is applied to the control electrode 25 of the first limiter tube 22 then it is undesirable for the electron-ray tube 50 to produce a minimum shadow angle which would be the case if electron discharge valve 58*a* alone were employed. In order to produce a maximum shadow angle under the zero signal condition at the input to the limiter 15 electron discharge valve 59 is employed. The cathode 65 of electron discharge valve 59 is grounded as indicated in Fig. 1 of the drawing. The anode 64 on the other hand is connected to the terminal 72. It will be apparent that if electron discharge valve 59 is rendered conducting a current will flow through the resistor 70 to produce a large shadow angle on the target 54 of the electron-ray tube 50. To produce the desired control the grid 66 of the electron discharge valve 59 is connected through a suitable current limiting resistor 82 to the control electrode 25 of the first limiter tube 22. A suitable filter comprising the capacitor 83 and the resistor 84 arranged in parallel may be provided to by-pass undesired voltages to ground as far as the control electrode 66 of electron discharge valve 59 is concerned. Preferably the electron discharge valve 59 is designed to require a substantial negative bias for cutoff. Under zero signal conditions, therefore, with no voltage applied to the control electrode 66 a high plate current is permitted to flow. Since this plate current must flow through the resistor 70 a wide shadow angle is produced. It will be understood that the higher the amplitude of the signal applied to the control electrode 25 of the first limiter tube 22 the greater the negative self bias on the control electrode 25 and consequently the greater the negative bias on the control electrode 66. For maximum signal conditions the negative bias on electrode 66 biases electron discharge valve 59 to cut off with the resultant minimum shadow angle indicated by electron-ray tube 50.

For the purpose of further controlling the electron-ray tube 50 in accordance with the present invention the anode 61*b* of the electron discharge valve 58*b* is connected to the source of +B potential 73 through a large current limiting resistor 87. The control electrode 62*b* on the other hand is connected through a current limiting resistor 88 and the conductor 77 to the discriminator output terminal 38*a*. The cathode 60*b* is connected to ground as clearly indicated and a suitable by-pass capacitor 89 connects the control electrode 62b to ground so that only the direct current potential at terminal 38a is effective with reference to control electrode 62b which is also true of control electrode 62a. The electron discharge valve 58b preferably has a characteristic such that it carries plate current when no voltage is applied to the control electrode 62b. However the large resistance 87 limits the plate current which may flow. The plate or anode 61b is connected directly to the grid 53 of the triode section of the electron-ray tube 50 thereby providing the desired bias for electron-ray tube 50. To provide a constant bias on control electrode 53 the plate 61b of the electron discharge valve 58b is connected to ground through a suitable current limiting resistor 90. With this arrangement it will be apparent that even when no current flows through electron discharge valve 58b a current from the +B source 73 flows to ground through resistors 87 and 90, so as to provide a constant bias for control electrode 53. The potential of control electrode 53 relative to ground decreases when plate current flows through electron discharge valve 58b.

To cause the triode section of the electron-ray tube 50 to operate at or below cutoff in the absence of a signal at the output of the discriminator 16, the cathode 52 is connected to ground through a resistor 91 and is furthermore supplied with a positive potential from the source 73 through a voltage dropping resistor 92, so that cathode 52 is normally considerably more positive relative to ground than is control electrode 53.

From the above discussion the operation of the tuning indicator unit of the present invention will be understood by those skilled in the art. It is desirable for the electron-ray tube 50 to have the characteristic represented by curve A in Fig. 2 of the drawing so as to have a minimum shadow angle when the frequency is equal to the center frequency $f_c$ and to have an increasing shadow angle when the frequency is displaced in either direction from the center frequency $f_c$. There should furthermore be produced a maximum shadow angle when the output of the discriminator is zero due to the fact that no signal is supplied to the limiter. The degree of the minimum shadow angle should furthermore depend upon the strength of the received signal and the tuning indicator should be sensitive enough to indicate the need for retuning of the receiver 10 before the mistuning exceeds the linear portion of the discriminator characteristic shown above the discriminator 16 in Fig. 1 of the drawing. When the voltage drop through one or both of the resistors 70 and 71 is substantially zero the electron-ray tube 50 will produce a minimum shadow angle indicating proper tuning. It will be understood that the voltage at the output of the discriminator 16 varies from a maximum positive value through zero to a maximum negative value depending on the degree and direction of mistuning.

In order to explain the operation of the present invention four limiting conditions of the tuning of the wave signal receiver 10 may be considered as follows: (1) when a signal is applied to the limiter and the discriminator direct current output voltage is zero; (2) when a signal is applied to the limiter but the set is mistuned in a direction so that a positive direct current voltage appears at the output of the discriminator; (3) when a signal is applied to the limiter but the set is mistuned in a direction so that a negative direct current voltage appears at the output of the discriminator; and (4) when no signal is applied to the input of the limiter with the result that the output voltage of the discriminator is zero.

When a signal voltage is applied to the limiter 15 and the direct current output voltage at the terminal 38a of the discriminator 16 is zero indicating correct tuning of the receiver 10, then no plate current can flow through electron discharge valve 58a which by virtue of the zero grid voltage is at cutoff. Furthermore since the receiver 10 is operated at exact resonance the control electrode 66 of the electron discharge valve 59 is biased negative to the maximum extent and the plate current flowing through electron discharge valve 59 approaches zero current. Consequently no current flows through the resistor 70 as far as the plate currents of electron discharge valves 58a and 59 are concerned. Electron discharge valve 58b carries plate current but due to the high resistance of the resistor 87 a positive voltage which is relatively low in comparison to the direct current plate supply voltage appears at the control electrode 53. Since electron-ray tube 50 is operated with a sufficiently positive cathode bias by virtue of the resistor 92 plate current is prevented from flowing through the triode section of the electron-ray tube 50 thereby preventing current flow through the resistors 70 and 71. Consequently the ray control electrode 56 is maintained at substantially the same potential as the target 54 which results in the minimum shadow angle of the target 54. It is apparent therefore that for the condition under consideration, the tuning indicator 19 properly indicates the resonant tuning condition.

When the receiver 10 is mistuned so that the center of the intermediate frequency signal is higher than the center frequency $f_c$, a positive voltage appears at the terminal 38a. This positive voltage causes electron discharge valve 58a to conduct plate current and this plate current flowing through resistor 70 tends to cause a substantial shadow angle to be produced on the target 54. The electron discharge valve 58b draws a slightly greater plate current than is the case under the first condition considered, whereupon the control electrode 53 becomes less positive so that the triode section of the electron-ray tube 50 is driven below cutoff. This does not substantially affect the operation of the indicator tube 50 however since it merely means that substantially no current flows through the resistor 71. The electron discharge valve 59 on the other hand draws more plate current under the present tuning condition than under the first situation considered, since the potential 25 of the first limiter tube 22 tends to approach zero voltage the greater the mistuning of the receiver since in the extreme mistuning condition no signal is applied to the limiter input. Consequently electron discharge valve 59 tends to conduct a high plate current with the result that a higher potential drop occurs across resistor 70 producing a wide shadow angle indicating substantial mistuning.

Under the condition when the wave signal receiver 10 is mistuned so as to produce a negative direct current voltage at the terminal 38a indicating that the center of the signal frequency is below the exact center frequency $f_c$ the electron discharge valve 58a is biased below cut off and no plate current flows therethrough. The control electrode 62b of electron discharge valve 58b is biased negative thereby causing electron discharge valve 58b to draw less plate current with the result that the control electrode 53 is rendered more positive relative to the cathode 52. This causes more plate current to flow through the triode section of the electron ray tube 50 and consequently through the resistors 70 and 71 in series with the result that the shadow angle tends to increase. The electron discharge valve 59 also conducts substantial plate current under this condition since the negative bias voltage appearing at the control electrode 66 is decreased substantially as the limiter grid 25 moves farther away from resonance. The high plate current flowing through electron discharge valve 59 further increases the voltage drop across resistor 70 so as to cause a wide shadow angle thus indicating considerable mistuning.

Under the fourth condition when no signal is applied to the limiter input, obviously the discriminator voltage output is zero so that no plate current can flow through electron discharge valve 58a. The plate current which flows through electron discharge valve 58b is insufficient to cause plate current to flow through the triode section of the electron-ray tube 50 by virtue of the positive bias applied to the cathode 52. Consequently these two electron discharge valves operate to maintain a minimum shadow angle. However, electron discharge valve 59 now has zero bias applied to its control electrode 66 so that it draws a maximum plate current with the result that the current flowing through the resistor 70 causes a large shadow angle to be produced.

It will be understood that various circuit arrangements and various circuit constants may be employed in connection with the arrangement of the present invention. In order, however, to illustrate the relative magnitudes of the principal elements of a typical circuit arrangement which has been found to satisfactorily embody the present invention the following approximate values of such elements, together with other pertinent information, are given for a particular device. It should be understood that these values are given by way of example only and not by way of limitation.

| | | |
|---|---|---|
| Electron discharge valve 22 | | 6SJ7 |
| Electron discharge valve 23 | | 6SJ7 |
| Resistor 26 | ohms | 22,000 |
| Resistor 27 | do | 1,200 |
| Capacitor 28 | microfarad | 0.01 |
| Capacitor 29 | micromicrofarads | 47 |
| Electron discharge valve 36 | | 6H6 |
| Resistor 44 | ohms | 220,000 |
| Resistor 45 | do | 220,000 |
| Electron discharge valve 50 | | 6U5/6G5 |
| Electron discharge valve 58 | | 6SL7 |
| Electron discharge valve 59 | | 6SQ7 |
| Resistor 70 | ohms | 680,000 |
| Resistor 71 | do | 390,000 |
| Resistor 75 | do | 1,800 |
| Resistor 76 | do | 1,000,000 |
| Capacitor 78 | microfarads | 0.1 |
| Resistor 80 | ohms | 150,000 |
| Resistor 82 | do | 100,000 |
| Capacitor 83 | microfarad | 0.01 |
| Resistor 84 | ohms | 1,000,000 |
| Resistor 87 | do | 100,000 |
| Resistor 88 | do | 1,000,000 |
| Capacitor 89 | microfarad | 0.1 |
| Resistor 90 | ohms | 33,000 |
| Resistor 91 | do | 8,900 |
| Resistor 92 | do | 4,720 |

While there has been described what is at present considered a preferred embodiment of the present invention it will be obvious to those skilled in the art that various changes and modifications may be made therein without departing from the present invention. It is aimed in the appended claims to cover all such changes and modifications as fall within the true spirit and scope of the present invention.

What is desired to be secured by Letters Patent of the United States is:

1. In a frequency modulated wave signal receiver of the type having a limiter, a detection network having an output circuit across which is produced a direct current voltage whose magnitude and polarity vary with the extent and sense of deviation of the center frequency of the applied signal, a visual resonance indicating tube of the type having a target capable of fluorescing and a control electrode for controlling the extent of the fluorescence of said target, a resistor interconnecting said target and said electrode, a source of positive potential connected to said target so that when no current flows through said resistor a maximum area of said target fluoresces and the larger the current flowing through said resistor the smaller the area of fluorescence on said target, a pair of electron discharge paths, each including a pair of electrodes to provide a current conducting path connected in series with said resistor, means for controlling the current flow through one of said discharge paths in accordance with the operation of said limiter in response to the intensity of the signal received by said receiver, and means for controlling the current flow through said second path in response to said magnitude and deviation in said direct current voltage.

2. In a frequency modulated wave signal receiver having a limiter, a detection network having an output circuit across which is produced a direct current voltage whose magnitude and polarity vary with the extent and direction of deviation of the center frequency of the applied signal, a visual resonance indicating tube of the type having a target a variable area of which is capable of fluorescing and a control electrode for controlling the extent of the area of fluorescence on said torget, a pair of serially arranged resistors interconnecting said target and said electrode, a source of positive potential connected to said target so that when no current flows through said resistors a maximum area of said target fluoresces and the larger the current flowing through one or both of said resistors the smaller the area of fluorescence on said target, a pair of electron discharge paths, each including a pair of electrodes to provide a current conducting path, means for connecting one of said resistors in series with the current conducting path of one of said discharge paths, means for connecting said one of said resistors in series with the current conducting path of the other of said discharge valves, means for controlling the current flow through one of said paths in accordance with the operation of said limiter in response to the intensity of the signal received by said receiver, and means for controlling the current flow through the other of said paths in response to said magnitude and deviation of said direct current voltage.

3. In a frequency modulated wave signal receiver having a limiter, a detection network having an output circuit across which is produced a direct current voltage whose magnitude and polarity vary with the extent and sense of shift of the center frequency of the applied signal, a visual resonance indicating tube of the type having a fluorescible target and a control electrode for controlling the extent of the area of effective fluorescence on said target, a resistor interconnecting said target and said electrode, a source of positive potential connected to said target so that when no current flows through said resistor a maximum area of said target fluoresces and the larger the current flowing through said resistor the smaller the area of fluorescence on said target, a pair of electron discharge paths, each including a pair of electrodes to provide a current conducting path connected in series with said resistor, means for controlling the current flow through one of said paths in accordance with the operation of said limiter in response to the intensity of the signal received by said receiver, means for controlling the current flow through said other path in response to said magnitude and sense of said direct current voltage, and a third electron discharge path comprising a pair of electrodes for establishing a third current conducting parth in series with said resistor, and means utilizing said third path for controlling the potential of the control electrode of said visual indicating tube in accordance with said magnitude and polarity of said direct current voltage.

4. In a frequency modulated wave signal receiver having a limiter, a detection network having an output circuit across which is produced a direct current voltage whose magnitude and polarity vary with the extent and sense of shift of the center frequency of the applied signal, a visual resonance indicating tube of the type having a fluorescent target and a control electrode for controlling the extent of the fluorescence on said target, a pair of serially arranged resistors interconnecting said target and said electrode, a source of positive potential connected to said target so that when no current flows through said resistors a maximum area of said target fluoresces and the larger the current flowing through one or both of said resistors the smaller the area of fluorescence on said target, a pair of electron discharge paths, each including a pair of electrodes for providing a current conducting path in series with one of said resistors, means for controlling the current flow through one of said discharge paths in accordance with the operation of said limiter in response to the intensity of the signal received by said receiver, means for controlling the current flow through the other of said paths in response to said magnitude and sense of said direct current voltage, and a third electron discharge path comprising a pair of electrodes for establishing a third current conducting path in series with said resistor, and means utilizing said third path for controlling the potential on a control electrode of said visual indicating tube in accordance with said magnitude and polarity of said direct current voltage.

5. In an angular velocity-modulated wave signal receiver of the type having a limiter, means for applying received signals to said limiter, a discriminator, means for applying the output of said limiter to said discriminator, said discriminator being characterized by a direct-current output voltage which is substantially zero when no input signal is present and also when said receiver is tuned to substantially exact resonance with an input signal but which has in the presence of mistuned signals a polarity dependent upon the direction of mistuning and a magnitude dependent upon the degree of mistuning, the combination of a visual resonance indicator adapted to provide a unique indication in the presence of a properly tuned input signal, means responsive to the direct-current output voltage of said discriminator for varying the response of said indicator as a function of the magnitude but independently of the sense of said output voltage, and means responsive to the substantial absence of signal at the input to said limiter for rendering said indicator substantially inoperative.

6. In combination with a source of input signals, a source of frequency-variable direct current voltage derived from said source of input signals, an electron-ray tube having a triode section including a control electrode and an indicator section, a source of steady direct current potential, a first electron discharge path including a control electrode connected to said source of frequency-variable voltage and a pair of current conducting electrodes constituting an anode and a cathode connected in series circuit relationship with said steady source of potential, said anode electrode being connected to the control electrode of said triode section for controlling the flow of current through said triode section in response to the conductivity of said first path, a second electron discharge path including a control electrode connected to said frequency variable source and a pair of current conducting electrodes constituting an anode and a cathode electrode connected in series with said steady source, whereby the current flow in said second path depends upon the potention of the frequency variable voltage, means for varying the operative condition of said indicator section in response to current flow through said second path, a third electron discharge path including a control electrode and a pair of current conducting electrodes constituting an anode and a cathode, said anode being connected to the anode in said second path, and means utilizing said third path for further controlling the operating condition of said indicator section in accordance with a predetermined characteristic of said input signal.

7. In combination with a source of input signals, a source of frequency-variable direct current voltage derived from said input signals, an electron-ray tube having a triode section including a control electrode and an indicator section, a pair of triodes each having its control electrode connected to said source of frequency-variable voltage, the anode of one of said triodes being connected to said control electrode for controlling the flow of current through said triode section in response to the current flow through said first triode, the anode of the other of said pair of triodes also being connected to said control electrode for independently controlling the effectiveness of said indicator section in response to the plate current flow through said second triode, and an electron discharge device having an anode electrode also connected to said indicator section for further controlling the effectiveness of said indicator section in accordance with a characteristic of said input signals.

8. In a frequency modulated receiver having a limiter-discriminator network with the output of said discriminator effectively providing a source of frequency-variable direct current voltage, the combination of an electron-ray tube having a triode section including a control electrode and an indicator section, a pair of triodes each having its control electrode connected to said source of frequency variable voltage, the anode of one of said triodes being connected to said control electrode for controlling the flow of current through said triode section in response to the current flow through said first triode, the anode of the other of said pair of triodes also being connected to said control electrode for independently controlling the effectiveness of said indicator section in response to the plate current flow through said second triode, and an electron discharge device having an anode electrode also connected to said indicator section for further controlling the effectiveness of said indicator section, and means inversely responsive to the amplitude of the signal at the input of said limiter for controlling the last-mentioned electron discharge device.

9. In a frequency modulated receiver having a limiter-discriminator network with the output of said discriminator effectively providing a source of frequency variable direct current voltage, the combination of an electron-ray tube having a triode section including a control electrode and an indicator section, a pair of triodes each having its control electrode connected to said source of frequency variable voltage, the anode of one of said triodes being connected to said control electrode for controlling the flow of current through said triode section in response to the current flow through said first triode, the anode of the other of said pair of triodes also being connected to said control electrode for independently controlling the effectiveness of said indicator section in response to the plate current flow through said second triode, and an electron discharge device having an anode electrode also connected to said indicator section for further controlling the effectiveness of said indicator section, and means responsive to the negative self-biasing potential at the input to said limiter-discriminator network for controlling said electron discharge device.

JOHN P. GRANT.

REFERENCES CITED

The following references are of record in the file of this patent:

UNITED STATES PATENTS

| Number | Name | Date |
|---|---|---|
| 2,286,410 | Harris | June 16, 1942 |
| 2,353,468 | Holst et al. | July 11, 1944 |